United States Patent [19]

Ishizuka

[11] Patent Number: 4,715,317

[45] Date of Patent: Dec. 29, 1987

[54] METHOD FOR PRODUCING OF POLYCRYSTALLINE SILICON AND APPARATUS THEREOF

[76] Inventor: Hiroshi Ishizuka, 19-2, Ebara 6-chome, Shinagawa-ku, Tokyo, Japan

[21] Appl. No.: 767,079

[22] Filed: Oct. 15, 1985

[30] Foreign Application Priority Data

Oct. 24, 1984 [JP] Japan .................................. 59-223177

[51] Int. Cl.$^4$ ............................................. C23C 16/24
[52] U.S. Cl. .................................... 118/719; 118/724; 118/725
[58] Field of Search ................. 118/722, 724, 725, 719

[56] References Cited

U.S. PATENT DOCUMENTS

| | | | |
|---|---|---|---|
| 3,147,141 | 9/1964 | Ishizuka | 118/724 |
| 3,335,697 | 8/1967 | Bischoff | 118/724 |
| 4,550,684 | 11/1985 | Mahawili | 118/724 |

*Primary Examiner*—Richard Bueker
*Attorney, Agent, or Firm*—Larson and Taylor

[57] ABSTRACT

A method for production of polycrystalline silicon, comprising: heating a deposition substrate in a reaction vessel of metal, bringing a gaseous silicon hydride close to said substrate, decomposing said silicon hydride, and producing to deposit silicon on the substrate, while the wall of said vessel is regulated in temperature at levels of, approximately, 100° to 450° C. simultaneously with a decrease of 100° to 700° C. from the temperature of said substrate and an apparatus for production of polycrystalline silicon, comprising: a reaction vessel of metallic material closed with a detachable lid, an inlet and an outlet for gas connected to said vessel, a jacket arranged over the substantial part of said vessel to provide an interspace between the jacket and vessel, a closed circuit for a gas consisting partly of said interspace, a two-way temperature controlling means for heating and cooling the gas provided on the circuit, and a deposition substrate of electrical conductive material extending in the vessel axially from the lid.

1 Claim, 3 Drawing Figures

METHOD FOR PRODUCING OF POLYCRYSTALLINE SILICON AND APPARATUS THEREOF

This invention relates to a method for production of a polycrystalline silicon and an apparatus therefor, by, in particular, thermal decomposition of a silicon hydride such as silane.

Polycrystalline silicon materials in general are produced on commercial scale by a process in which a deposition substrate or filament of silicon or other high melting point metal is heated electroresistively to some 800° C. or more, and fed with a gaseous silicon hydride such as monosilane (SiH4) and disilane (Si2H6) to decompose and yield silicon thereon. The process is usually conducted in a stainless steel vessel with the wall being water-cooled intensively almost to room temperatures in order to suppress the decomposition proceeding wastefully elsewhere to result often in a pulverized deposit of silicon, and that the product growing on the substrate may not be contaminated by any readily volatile ingredient of the vessel material, while the filament, on the other hand, essentially has to be heated to elevated temperatures of the order of 900° C. to allow the decomposition to proceed at practical rates. That results inevitably in rather a high power consumption relative to the mass of the product, with a very limited part of the power input being effective for sustaining the process, while the balance is wastefully removed by the coolant water.

Meanwhile the deposition substrate commonly is made of a high purity silicon filament, which at temperatures less than some 400° C. exhibits rather a high electrical resistance and, thus, needs an increased voltage or a specialized preliminary heating means in order to reach an operating temperature over such range.

Therefore, one of the principal objects of the present invention is to provide a novel technique which has been eliminated of above said problems.

The Inventor has found and based this invention on that monosilane start decompositions at 380° C., approximately, and the decomposition increases in rate only very slowly to a level at some 450° C. less than 1/2000 that at 700° C., so maintaining the wall around 400° C. will allow only a practically negligeable proportion of silicon deposit outside the filament heated at 800° C. or more.

According to the invention there is provided a method for production of polycrystalline silicon, comprising: heating a deposition substrate in a reaction vessel of metal, bringing a gaseous silicon hydride close to said substrate, decomposing said silicon hydride, and producing to deposit silicon on the substrate, while the wall of said vessel is regulated in temperature at levels of, approximately, 100° to 450° C. simultaneously with a decrease of 100° to 700° C. from the temperature of said substrate.

In the method of the invention applicable silicon hydrides include mono-, di- and some other silanes and derivatives which do not form chlorine or other substances aggressive towards steel, in order that the latter may be available as vessel material.

The vessel wall is heated at temperatures within the above said range and, preferably, between 300° and 450° C. inclusive, with a decrease of 300° to 500° C., simultaneously, relative to the temperature of the deposition substrate as red heated. Such condition can be effectively provided with an apparatus comprising: a reaction vessel of metallic material closed with a detachable lid, an inlet and an outlet for gas connected to said vessel, a jacket arranged over the substantial part of said vessel to provide an interspace between the jacket and vessel, a closed circuit for a gas consisting partly of said interspace, a two-way temperature controlling means for heating and cooling the gas provided on the circuit, and a deposition substrate of electrical conductive material extending in the vessel axially from the lid.

In such apparatus the interspace may be provided either by arranging a gas-tight jacket over the substantial part of the reaction vessel as well as the detachable lid, or the vessel as a whole can be placed in a larger casing of metallic material; a neutral gas such as, preferably, argon or hydrogen, is held in the space at a pressure positive of the atmosphere, in order to better suppress any air leakage and better remove the heat from the vessel wall during the process.

The temperature controlling means comprises an electrical heater, which may be of conventional design, arranged either within the interspace or on the circuit thereoutside, and a heat exchanger with water coolant.

One or more deposition substrates are arranged to extend axially in the reaction chamber with the upper or lower end or ends fixed to an end of the chamber. When the substrates or substrate portions of axial construction are arranged in adjacency and parallel with each other, they are separated with a hollow insulation partition which has inwards a cavity in communication with the temperature controlling means and which extends along the substrates or substrate portions, so no part else of the space within the vessel is hot enough to produce an appreciable proportion of pulverized deposit. The partition cavity conveniently can be united with the interspace within the jacket which surrounds the reaction vessel as a whole. Said cavity as well as the interspace is loaded with an inert gas temperature regualted to proper levels, so as to allow said partition to be kept at temperature levels close to those around the outside wall.

The gas spaces thus provided around and inside the reaction vessel can be served to preheat the deposition substrate to the order of 400° C. where the electrical resistivity substantially is decreased, by passing a properly heated gas. This feature allows to start up the substrate with a decreased voltage without resort to an additional specialized heater heretofore indispensable. As the reaction system used in the invention is not aggressive towards metallic materials, a wide variation is available, for constructing the reaction vessel, among those which do not comprise any ingredients highly volatile at temperatures around 500° C. Some grades of stainless steel may be mentioned as preferable examples for simplified maintenance.

Now the invention will be described more in particularity in the following description taken in connection with the accompanying drawing which is given by way of example only and not limiting the invention.

Figure 1:
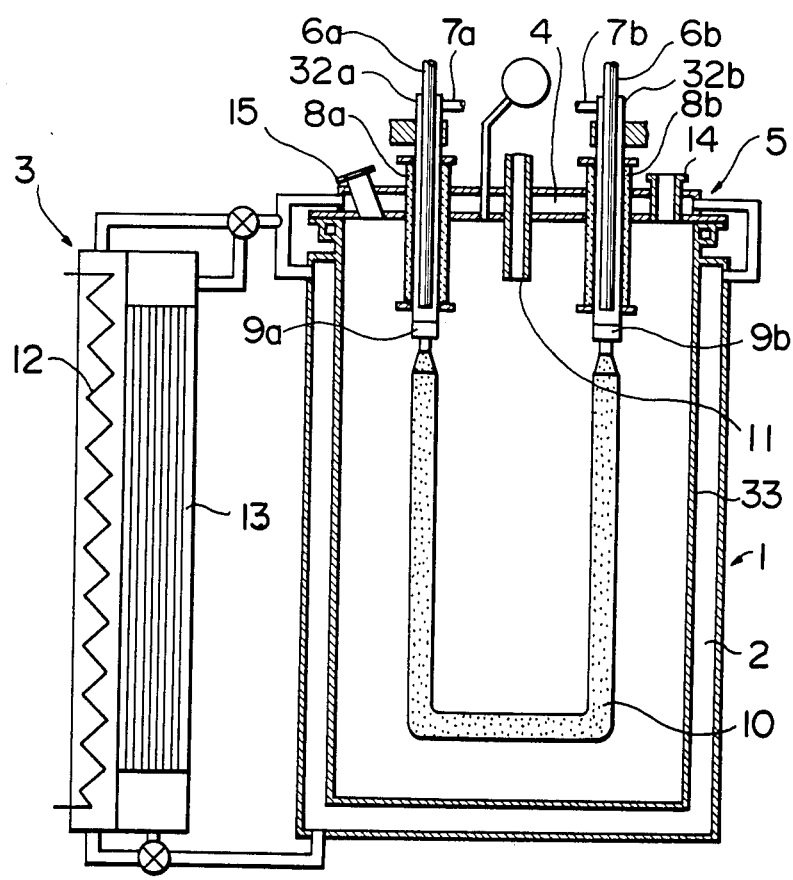
FIG. 1 shows the elevation in section of an apparatus for practice of the invention and realized according thereto.

In FIG. 1, particularly, the reaction vessel designated generally at 1 has a substantially cylindrical, closed construction, provided thereover with a jacket 2, which is connected at upper and lower ends with the inlet and outlet of a temperature regulator 3 by piping. The reaction vessel 1 is closed at the upper end with a lid 5 covered with a jacket 4, through which the electrode assemblies are arranged to extend into the vessel. Each of said electrode assemblies comprises for cooling a hollow body 32a, 32b of high conductive metal, through which water is allowed to pass via inlet 6a, 6b and outlet 7a, 7b, and for insulation, a sleeve 8a, 8b. The assemblies support at joints 9a and 9b a round rod 10 of high purity silicon in U shape, in this particular example, to serve as deposition substrate. Silicon hydride is supplied through an introduction nozzle 11, and decomposed on and around the substrate to yield a silicon which deposits thereon. During the process the vessel wall 33 is kept at temperatures between 100° and 450° C. by passing through jackets 2 and 4 on the vessel wall 33 and lid 5, a gas, temperature regulated in the device 3 which allows the gas to circulate through a heater 12 or a cooler 13 as needed. A degassing port 14 is arranged in the top 5 for removal of the hydrogen byproduct, as well as evacuation prior to the process. The process can be observed through a peephole 15.

Figure 2:
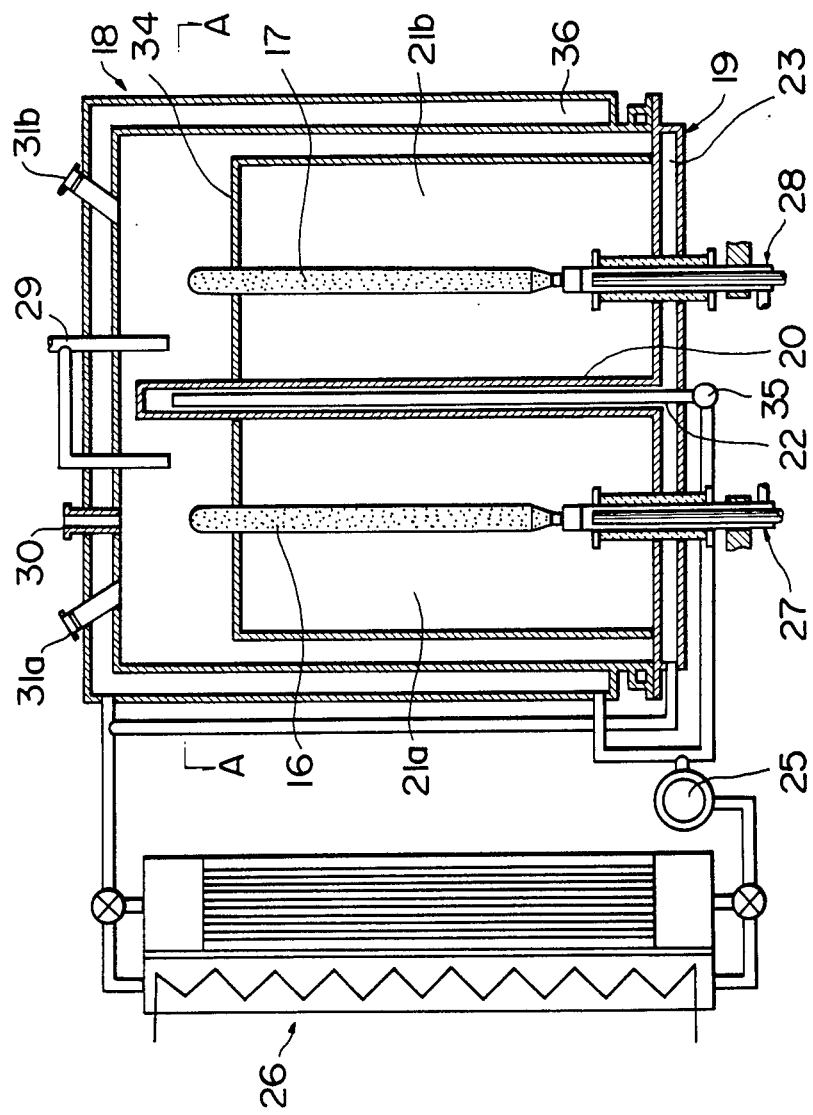
FIG. 2 shows the elevation in section of another such apparatus.
Figure 3:
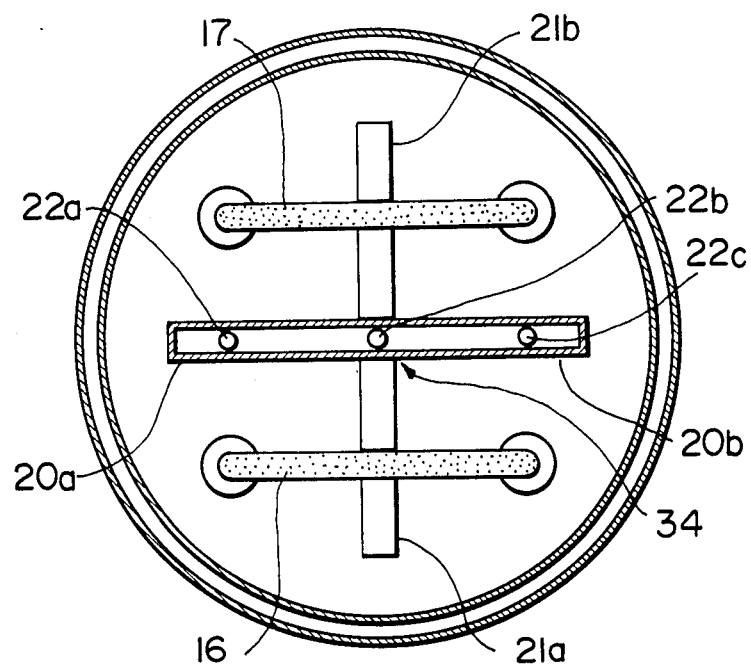
FIG. 3 shows the sectional horizontal view as taken along A—A on FIG. 2.

In FIGS. 2 and 3, two deposition substrates 16 and 17 are arranged in a single reaction vessel 18. The setup is basically common with that in FIG. 1, with such modifications that: the substrates are supported over a lid 19 covering the vessel 18, at the bottom. The vertical portions of the substrates 16 and 17 are separated for the most part by a partition 34 which comprises a crosswise extending set of hollow wings 20a and 20b intervening between the two substrates and wings 21a and 21b between the vertical portions of each substrate. The partition cavities in each direction are preferably sectioned for an orderly circulation of the gas and thus an improved temperature controllability, by inserting a pipe or pipes 22a and 22b so as to lead effectively the gas upwards in the partition. Such pipe or pipes are joined to a main 35, while the partition cavity is communicated at the bottom with the jacket 23. A gas circuit is so formed that the gas as driven by a blower 25 is forced through piping into the guide pipies 22a, 22b and 22c in the partition as well as the vessel wall jacket 36. The gas coming out from the jackets 23 and 36 is allowed to enter the temperature regulator 26. The partition should have height and width dimensions large enough to block the substantial part of the heat radiation from the vertical substrate portion in closest adjacency. Electrode assemblies have cooling and insulation arrangement, which may be of common construction to those in FIG. 1.

The starting material of silicon hydride is introduced through a forked nozzle 29, the hydrogen byproduct is removed through a port 30, which also can serve for evacuation prior to the process. The process can be monitored through peepholes 31a and 31b.

EXAMPLE 1

An arrangement basically illustrated in FIG. 1 was used. The cylindrical vessel of heat resistant steel (equivalent to AISI 316) measured 1.2 m in I.D. and 2.0 m in length and had a 10 cm spaced jacket over the whole surface. The temperature regulator was an electrically heatable and water coolable type. A 5 mm diameter substrate of high purity silicon comprised two vertical portions 120 cm long each, and a horizontal portion 60 cm long and joined thereto at each end. The jacket was charged with a heated argon to heat the vessel and, thus, the substrate to 500° C. as measured on the vessel wall. Power supply was started to the substrate when a temperature of some 450° C. had been reached. Reaction was caused by supplying a mixed gas with a $SiH_4/H_2$ ratio of 0.1 onto the substrate maintained at some 900° C., while cooling the vessel wall to levels around 400° C.

The substrate grew at rates between 8–10 $\mu$m/min. and to a diameter of 100 mm in some 90 hours of the process. The period is only almost half as long, with a power consumption decreased by as much as 70% to obtain a product of comparable quality, relative to conventional methods with the reaction vessel cooled to room temperatures.

EXAMPLE 2

The method of Example 1 was repeated except that the substrate was heated instead to some 1,000° C. At a reaction rate increased to twice that in Example 1, the product still exhibited a similarly high quality.

EXAMPLE 3

The method of Example 1 was repeated but until a product diameter of 150 mm was reached. The required time was about 130 hours, with a decrease to almost 45% that required with conventional methods. The power consumption was reduced by 75%, with the product quality similarly high.

I claim:

1. An apparatus for production of polycrystalline silicon, comprising: a reaction vessel of metallic material closed with a detachable lid, a deposition substrate of electrically conductive material comprising a plurality of portions extending axially from the lid, an inlet for introducing reactant gas into said vessel, an outlet for removing reactant gas from said vessel, a jacket arranged over a substantial part of said vessel providing an interspace between the jacket and vessel, a hollow partition comprising several wings, said wings each having an inner cavity and being arranged to extend radially between and to separate two adjacent vertical portions of the deposition substrate, said cavity having inner tubes through which cooling medium is allowed to flow, a closed circuit for circulating a gas, said circuit being filled with gas and including said interspace and said partition cavities, and a two-way temperature controlling means in communication with said interspace and partition cavities, said temperature controlling means being capable of heating and cooling said gas and being capable of keeping the vessel wall in the temperature range of about 100° to 450° C., while simultaneously maintaining a temperature difference of about 100° to 700° C. between said vessel wall and said substrate.

* * * * *

UNITED STATES PATENT AND TRADEMARK OFFICE
CERTIFICATE OF CORRECTION

PATENT NO. : 4,715,317

DATED : December 29, 1987

INVENTOR(S) : ISHIZUKA, Hiroshi

It is certified that error appears in the above-identified patent and that said Letters Patent is hereby corrected as shown below:

Title page: item [21] should read as follows:

-- [21] Appl. No.: 787,079 --

Signed and Sealed this

Sixteenth Day of August, 1988

Attest:

DONALD J. QUIGG

Attesting Officer     Commissioner of Patents and Trademarks